United States Patent [19]
Takao

[11] Patent Number: 5,266,511
[45] Date of Patent: Nov. 30, 1993

[54] PROCESS FOR MANUFACTURING THREE DIMENSIONAL IC'S

[75] Inventor: Yoshihiro Takao, Kawasaki, Japan

[73] Assignee: Fujitsu Limited, Kawasaki, Japan

[21] Appl. No.: 954,032

[22] Filed: Sep. 30, 1992

[30] Foreign Application Priority Data

Oct. 2, 1991 [JP] Japan .................................. 3-255019

[51] Int. Cl.⁵ ............................................ H01L 21/72
[52] U.S. Cl. ..................................... 437/51; 437/915; 437/924; 148/DIG. 12
[58] Field of Search ................... 437/48, 51, 915, 924, 437/966, 974; 148/DIG. 12, DIG. 102, DIG. 135, DIG. 164

[56] References Cited

U.S. PATENT DOCUMENTS

| | | | |
|---|---|---|---|
| 4,789,214 | 12/1988 | Vilhelmsson et al. | 437/924 |
| 4,902,637 | 2/1990 | Kondou et al. | 437/915 |
| 5,075,253 | 12/1991 | Sliwa | 437/51 |
| 5,087,585 | 2/1992 | Hayashi | 437/915 |

*Primary Examiner*—Brian E. Hearn
*Assistant Examiner*—C. Chaudhari
*Attorney, Agent, or Firm*—Staas & Halsey

[57] ABSTRACT

A first semiconductor substrate comprises an integrated circuit formed therein and an alignment mark formed thereon. The top surface of the first semiconductor substrate is covered with a first insulating layer and is planarized. The alignment mark is formed in a space between a plurality of groups of elements, such as a scribe line area. A second semiconductor substrate is provided with a groove corresponding to said space, or scribe line area, and a second insulating layer is formed on thereon and so as to bury the groove, and the exposed surface of the second insulating layer is planarized. The two planarized surfaces of the first and second semiconductor substrates are positioned in facing, contiguous relationship and are bonded to each other, while an infra-red microscope is used for alignment of the space and the groove. The back surface of the second semiconductor substrate is selectively etched until the second insulating layer, as filed in the groove, is exposed. A second integrated circuit is formed in the second semiconductor substrate at a position therein determined by detecting the alignment mark on the first semiconductor substrate through a visible ray microscope.

6 Claims, 7 Drawing Sheets

PROCESS FOR MANUFACTURING THREE DIMENSIONAL IC'S

BACKGROUND OF THE INVENTION

1. Field of the Invention

The present invention relates to a process for manufacturing a three dimensional IC device.

2. Description of the Related Art

In order to increase the degree of integration, various proposals for two dimensional IC (integrated circuit) devices have been made and utilized. As the two dimensional integration technique however has an eventual limitation with respect to the degree of integration, development of a technology for producing three dimensional devices has been considered and proposals have been made in relation to said technology. Nevertheless, the proposed three dimensional technologies thus far include those that can be utilized only in laboratories and those that can be utilized in IC manufacturing lines only to a very limited extent. Accordingly, commercial ICs are only two dimensional and further development of three dimensional IC technology is in great demand.

A three dimensional IC device in which a transistor integrated circuit is formed over an interlayer insulating layer, the interlayer insulating layer being formed on a transistor integrated circuit formed in a silicon substrate, was proposed so as to obtain a static random access memory (SRAM) having a large capacity and a low power consumption or other devices (see Y. Inoue et al, Symp. VLSI Tech., Tech. Dig., p.39, 1989 "4PMOS/2NMOS Vertically Stacked CMOS-SRAM with 0.6 μm Design Rule"). In this proposal, a polysilicon layer is deposited over an interlayer insulating layer formed on a bulk, in which an integrated circuit is formed; the deposited polysilicon layer is then fused and recrystallized by an energy beam such as a laser beam; and, in this recrystallized silicon layer, transistors are formed to thus obtain a three dimensional integrated circuit.

This recrystallization process requires a long time, for example, about 3 hours when a wafer having a diameter of about 10 cm or 4 inches is entirely treated with an Ar laser; the crystallinity of the recrystallized layer is lowered as the number of laminated recrystallized layers increases, and the underlying integrated circuit device suffers deterioration of its characteristics from the heat required for the fusion and recrystallization of the overlaying layer.

There was also proposed a process for manufacturing a three dimensional integrated circuit device by bonding two semiconductor substrates having an integrated circuit formed therein; one of the two semiconductor substrates having a tungsten (W) bump, the other having an Au/In pool filled in a hole of a polyimide layer and the W bump and the Au/In pool being bonded with each other (see Y. Hayashi, "Evaluation of CUBIC (Cumulatively Bonded IC) Devices", 9th Symposium on Future Electron Devices, Nov. 14-15, 1990, pp 267-272). In this technique, the problems involved in the recrystallization process are removed, but the alignment, of the W bump with the Au/In pool, is made through an infra-red microscope that is not precise and makes the size of the Au/In pool as large as, for example, 8 μm×8 μm. Thus, the degree of integration suffers.

There is further proposed a process for manufacturing a three dimensional integrated circuit device, in which a second semiconductor substrate is bonded to a first semiconductor substrate through an insulating layer therebetween; the first semiconductor substrate having an integrated circuit and an alignment mark formed therein; and a second integrated circuit is then formed in the bonded second semiconductor substrate using said alignment mark of the first semiconductor substrate (see Japanese Unexamined Patent Publication (Kokai) No. 03-11658).

In this process, however, the alignment of the second semiconductor substrate with the first semiconductor substrate is made through a mechanical prealignment that is not precise and needs more than several tens m tolerance. Also, to expose the alignment mask after bonding the first to the second semiconductor substrates, an additional mask alignment step is required, which is disadvantageous from the viewpoint of not only accuracy but also process simplicity.

The object of the present invention is to provide a process for manufacturing a three dimensional integrated circuit device with a high degree of integration without deterioration of the crystallinity of the crystalline layer and the characteristics of the integrated circuit over a long period of time.

SUMMARY OF THE INVENTION

The above and other objects are attained by providing a process for manufacturing a three dimensional integrated circuit device, comprising the steps of I) preparing a first semiconductor substrate in which a first integrated circuit containing element groups is formed and an alignment mark of a first material is formed in a space between said element groups, forming a first insulating layer of a second material over the first semiconductor substrate; the second material being different from the first material; the first insulating layer having a top surface, and planarizing said top surface of the first insulating layer of the first semiconductor substrate, II) preparing a second semiconductor substrate having a main surface; the second semiconductor substrate having a recess on said main surface at a place corresponding to said space of the first semiconductor substrate; said recess of the second semiconductor substrate having a width wider than that of said alignment mark and being buried with a second insulating layer, and planarizing the second insulating layer and the main surface of the second semiconductor substrate, so that the second semiconductor substrate has a planarized top surface and a back surface opposite said top surface, III) bonding the first and second semiconductor substrates with each other so that the first and second insulating layers face each other and said recess of the second semiconductor substrate corresponds to said space of the first semiconductor substrate by detecting said space of the first semiconductor substrate through the second semiconductor substrate with a light, IV) making the second semiconductor substrate thin by removing the back side of the second semiconductor substrate until said second insulating layer is exposed, and V) finding said alignment mark of the first semiconductor substrate, and forming a second integrated circuit in the second semiconductor substrate that is aligned with said aligning mark of the first semiconductor substrate.

In the step (IV) of this process, if the back side of the second semiconductor substrate is removed by selective etching the semiconductor of the second semiconductor substrate, the second insulating layer can act as a stopper of the selective etching. As a result, when the selective etching is stopped, islands of the semiconductor surrounded by the second insulating layer and overlying the first insulating layer are obtained.

In preferred embodiments, the second and first insulating layers are etched, using the semiconductor of the second semiconductor substrate as a mask to expose the alignment mark. The alignment is carried out by an infra-red microscope for finding said space of the first semiconductor substrate and said recess of the second semiconductor substrate and by a visible ray microscope for finding the alignment mark. The said space of the first semiconductor substrate is a scribe line of the substrate.

In accordance with the present invention, as the integrated circuit of the second or further semiconductor layer is aligned with the alignment mark of, the first semiconductor layer, the alignment fineness, or precision, is the same as that of a single layer integrated circuit (even less than 0.1–0.2 μm). A large alignment area such as the Au/In pool is not necessary. The detection of the space of the first semiconductor substrate and the recess of the second semiconductor substrate is made by an infra-red microscope that attains a finer alignment (several μm) than that of the mechanical prealignment of the prior art (several tens μm).

Further, when the alignment mark is exposed by etching the second and first insulating layers, the semiconductor of the second semiconductor substrate acts as an etching mask and no additional photolithographic process is necessary.

Moreover, the crystallinity of the upper semiconductor layer is not lowered and the underlying semiconductor devices do not suffer from deterioration by the heat required for recrystallization of the upper semiconductor layer.

DESCRIPTION OF THE PREFERRED EMBODIMENTS

An example of the process of the present invention is described more in detail with reference to FIGS. 1 to 7.

Figure 1:
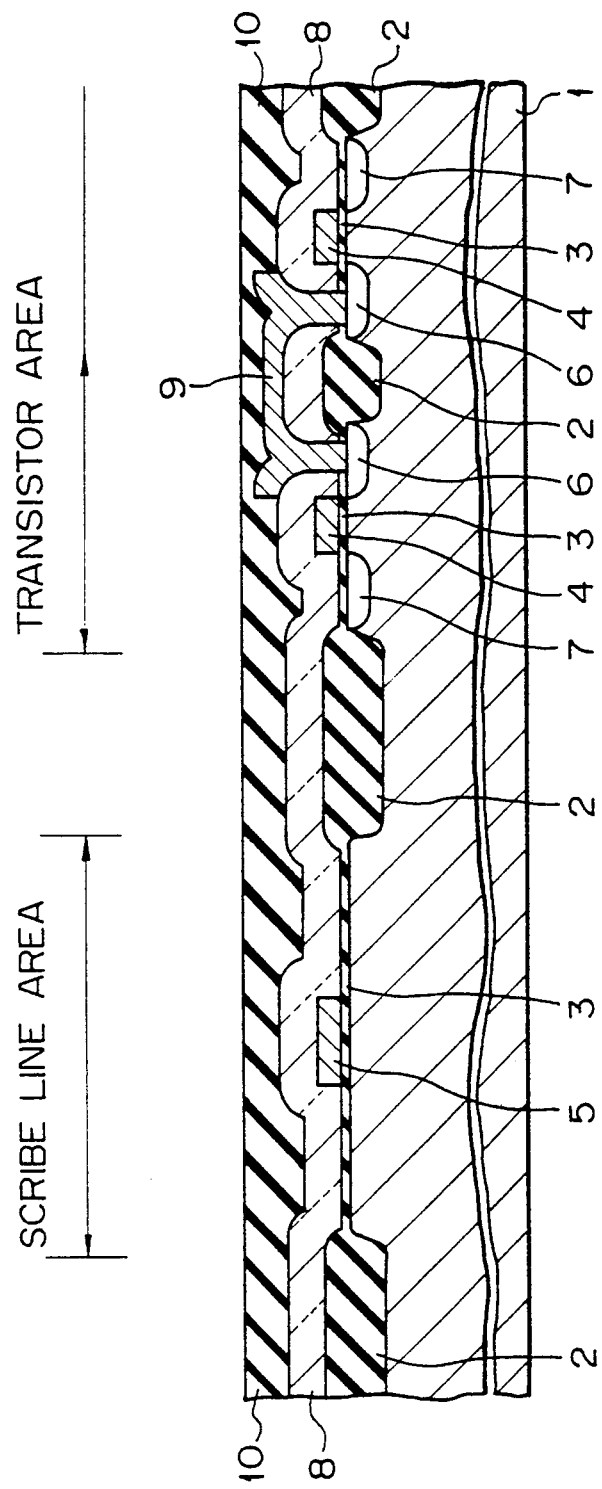
FIGS. 1 to 7 illustrate the main steps of manufacturing a three dimensional integrated circuit device in accordance with the present invention.

First, FIG. 1 is referred to. An integrated circuit device is formed in a first semiconductor substrate by forming normal MIS (metal insulator semiconductor) FETs (field effect transistors) in accordance with a conventional process. This process of forming the integrated circuit device in the first semiconductor device is not particularly limited and therefore the construction of the device in FIG. 1 is briefly described.

In FIG. 1, 1 denotes a p-type silicon semiconductor substrate, 2 a field oxide layer formed, for example, by a LOCOS (local oxidation of silicon) process with a silicon nitride ($Si_3N_4$) layer formed on an ultra thin silicon dioxide film being used as an oxidation resistant mask; the field oxide layer being an $SiO_2$ layer about 600 nm thick, 3 a gate insulating layer formed by removing the oxidation resistant mask layer and forming an $SiO_2$ layer about 25 nm thick through oxidation of the silicon semiconductor substrate 1, 4 a gate electrode of a polycrystalline silicon formed on the gate insulating layer 3, 5 an alignment mark of a polycrystalline silicon formed in a scribe line area simultaneously with the gate electrode 4, 6 an $n^+$-type source region formed in alignment using the gate electrode 4 as a mask, and 7 an $n^+$-type drain region formed in alignment using the gate electrode 4 as a mask.

A PSG (phospho-silicate glass) layer 8, about 300 nm thick, is deposited entirely over the substrate by CVD (chemical vapor deposition). The PSG layer 8 and the gate insulating layer 3 are locally etched by normal lithography including a resist process and an RIE (reactive ion etching) with $CF_3/CHF_3$ to open an electrode contact hole over the $n^+$-type source region 6.

A CVD is adopted to deposit a W polycide (WSi/polySi layer about 300 nm thick. A reflow process may be optionally utilized to make the surface of the PSG layer 8 smooth before the deposition of the W polycide layer. The W polycide layer is subject to a normal lithograph including a resist process and an RIE with $CCl_4/O_2$ as an etching gas to form interconnection lines 9.

An $SiO_2$ layer 10, about 600 nm thick, is deposited entirely by CVD. The $SiO_2$ layer 10 is planarized by an etching back process step, followed by mirror polishing to make the surface of the $SiO_2$ layer 10 more planer. After these processes, the $SiO_2$ layer 10 has an average thickness of about 300 nm, for example.

Figure 2:
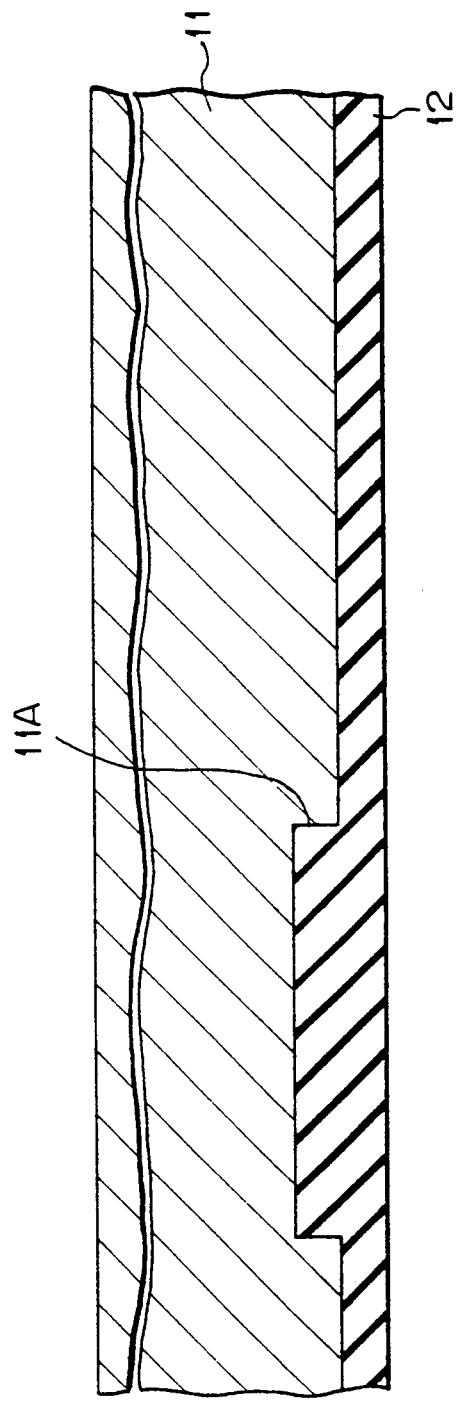

FIG. 2 is referred to.

An n-type silicon substrate 11 as a second semiconductor substrate is subject to lithography including a resist process and an RIE with $CCl_4/O_2$ as an etching gas to locally etch a region of the (lower) surface region of the n-type silicon substrate so that a groove 11A having the same pattern as the scribe line area of the p-type silicon substrate 1 and a depth of about 0.5 μm is formed.

A CVD is conducted to deposit an $SiO_2$ layer 12, about 1 μm thick, on the n-type silicon substrate 11 on the groove side (i.e., lower surface).

The $SiO_2$ layer 12 is planarized by an etch back process step, followed by mirror polishing so as to improve the planar qualities of the surface thereof.

After these processes, the $SiO_2$ layer 12 has a thickness of about 700 nm in the portion thereof covering the groove 11A.

The silicon substrates 1 and 11 may be processed in an optional order or simultaneously.

Figure 3:
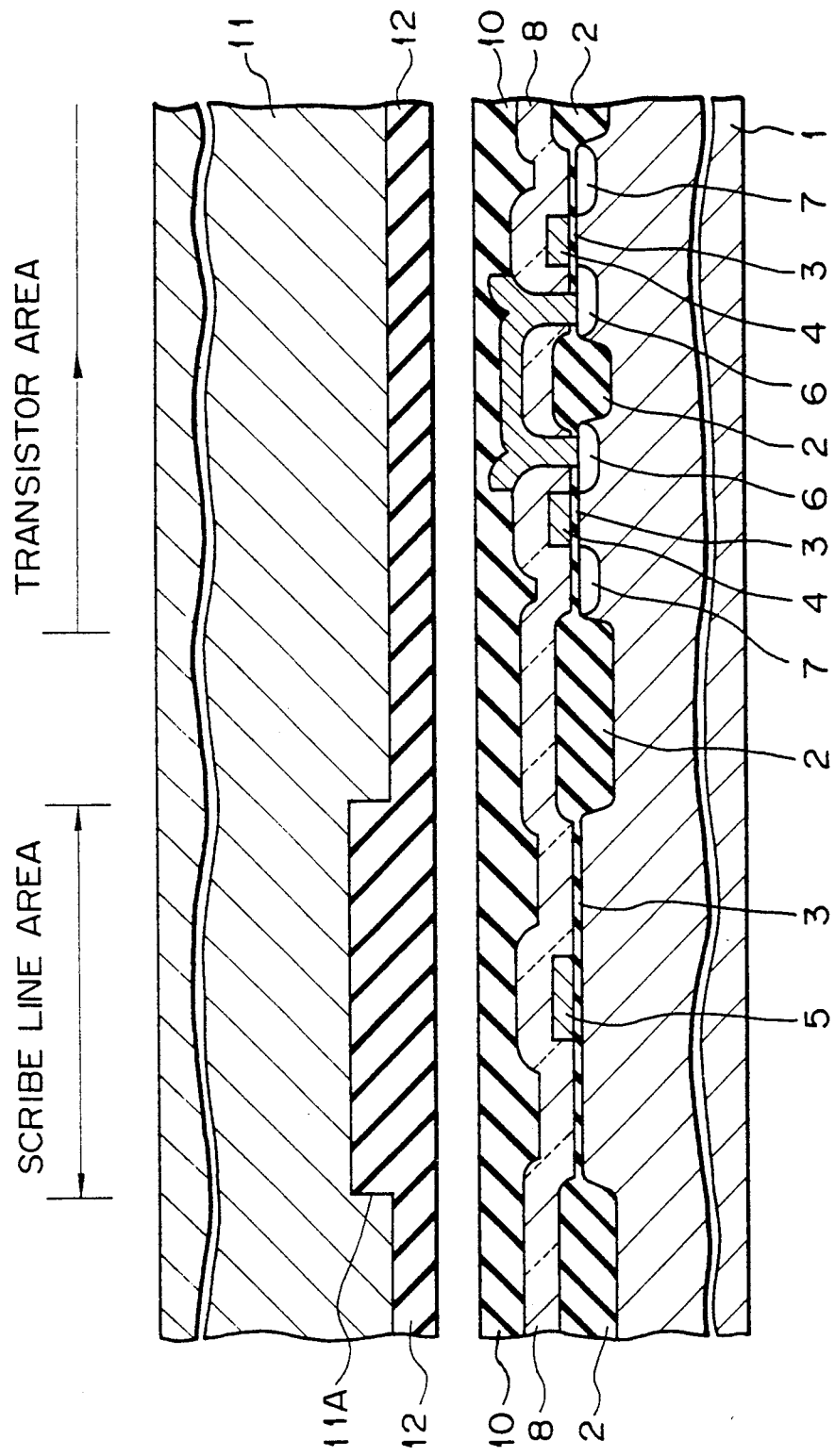

FIG. 3 is referred to.

The $SiO_2$ layer 10 of the p-type silicon substrate 1 and the $SiO_2$ layer 12 of the n-type silicon are positioned so as to face each other and the scribe lines of the respective silicon substrates are overlapped (i.e., aligned) and then brought into contact with each other (see FIG. 14), and the assembled structures are then heat treated, for example, at 90020 C. in an $N_2$ atmosphere so that the $SiO_2$ layers 10 and 12 are bonded to each other.

When the p-type silicon substrate 1 is aligned with the n-type silicon substrate 11, the mark 5 of the p-type silicon substrate 1 cannot be detected through the n-type silicon substrate by a visible ray microscope. Accordingly, an infra-red microscope is used to detect the p-type silicon substrate 1. The alignment fineness of the infra-red microscope is about 2–4 μm because of the large wave length of the infra-red ray, making a very fine alignment difficult, but the mark 5 to be detected of the p-type silicon substrate 1 by an infra-red microscope is in a scribe line area having a width as large as about 80 μm, thereby facilitating the alignment of the n-type silicon semiconductor substrate 11 on the p-type silicon semiconductor substrate 1.

Figure 4:
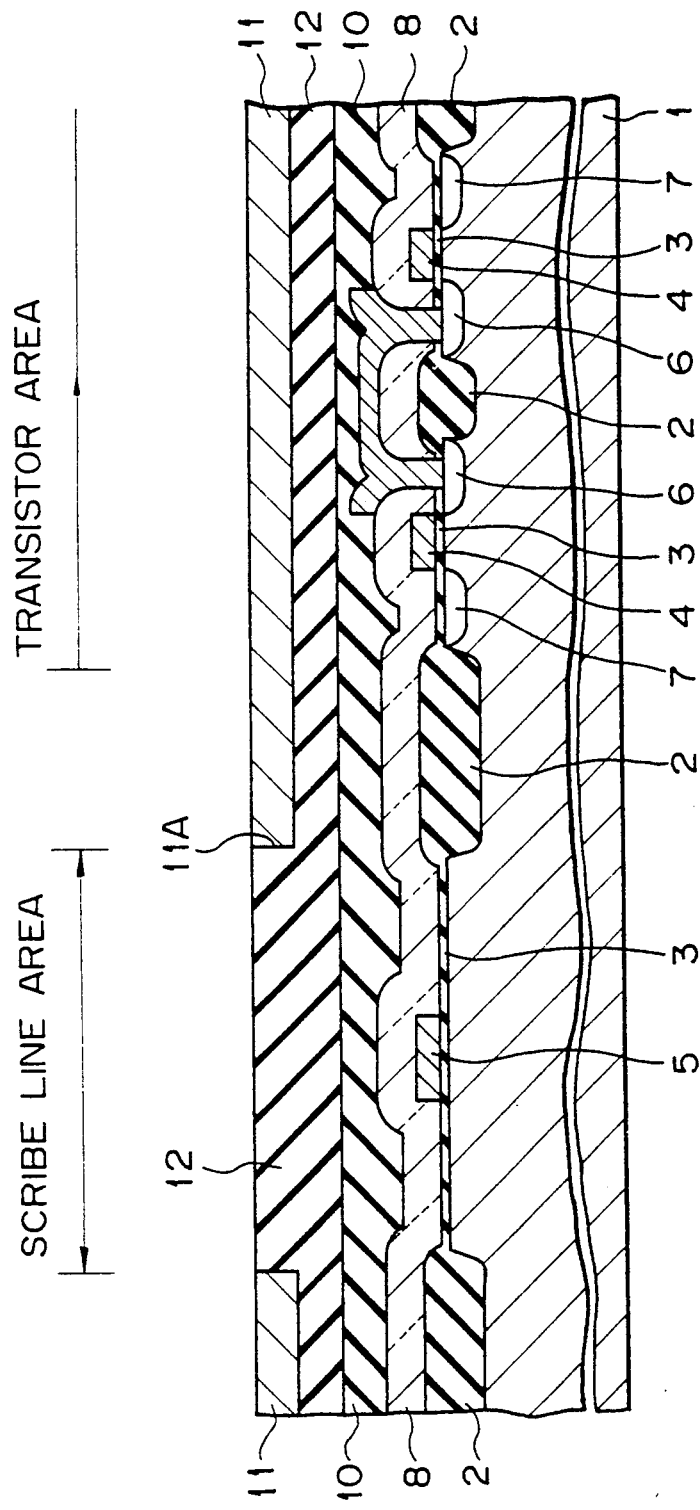

FIG. 4 is referred to.

A back side portion of the n-type silicon semiconductor substrate 11 is removed, for example, by selectively polishing the n-type silicon semiconductor with colloidal silica as an etchant. The colloidal silica etches silicon but scarcely etches $SiO_2$, so that the etching of the n-type silicon semiconductor substrate 11 is almost stopped when the $SiO_2$ layer 12 buried in the groove 11A is exposed. Namely, the $SiO_2$ layer 12 acts as a stopper of the etching of the n-type silicon semiconductor substrate 11.

As a result of this step, islands of silicon are formed from the substrate 11, surrounded by an insulating layer of the bonded $SiO_2$ layers 10 and 12 over the p-type silicon semiconductor substrate 1 containing an integrated circuit device. Nevertheless, these islands of silicon will still be referred to as the n-type silicon semiconductor substrate 11, for the sake of simplicity.

Figure 5:
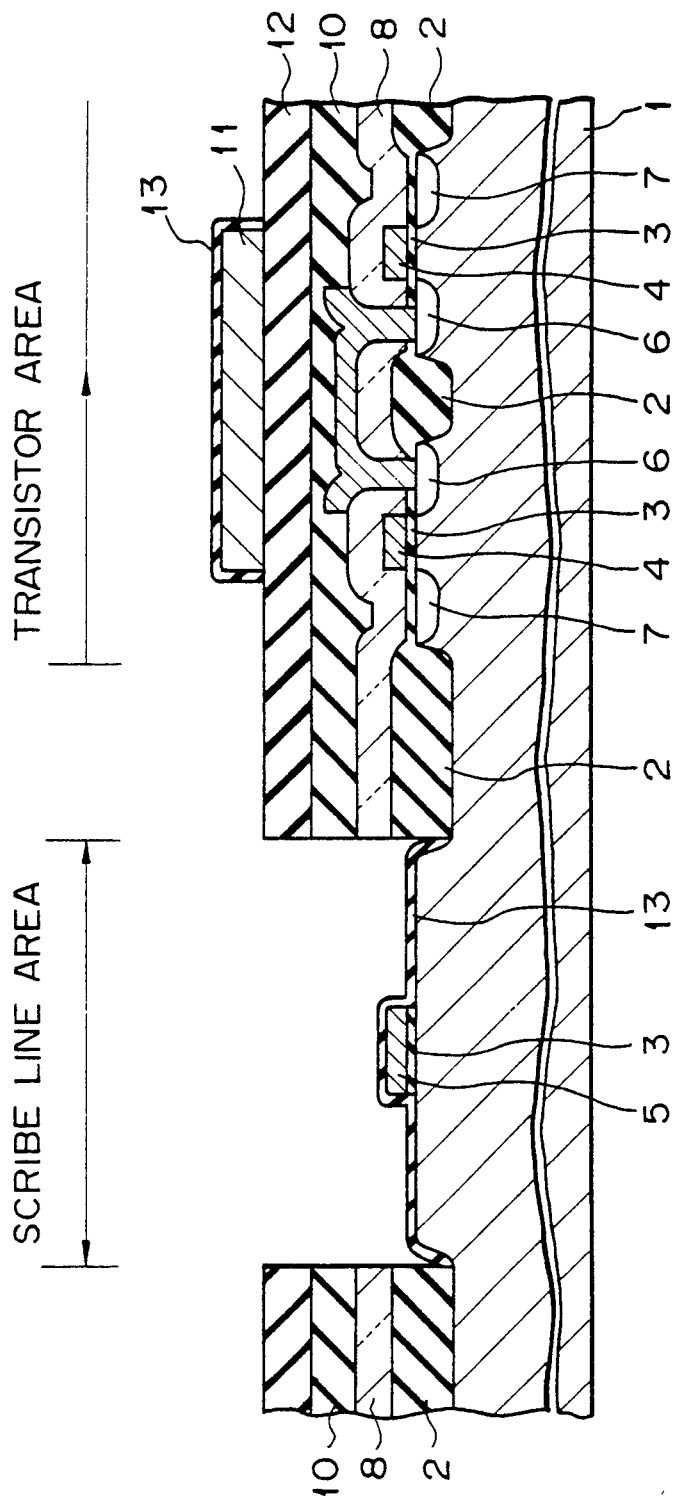

FIG. 5 is referred to.

An RIE process is adopted using $CF_4/CHF_3$ as an etching gas to remove the $SiO_2$ layer 12, $SiO_2$ layer 10, PSG layer 8 and gate insulating layer 3, in the portions thereof within the scribe line area, by anisotropic etching, to thereby expose the alignment mark 5 of the polycrystalline silicon.

In this etching process, as the silicon of the n-type silicon semiconductor substrate 11 acts as a mask, a resist mask formation process is not necessary, which is one of the advantages of the present invention.

A lithography step, including a resist process and an RIE process with $CCl_4/O_2$ as an etching gas, is applied so as to conduct a mesa etching of the silicon islands of the n-type silicon semiconductor substrate 11 so that an insulation separation is carried out. 52665114.002

A gate insulating layer 13 of $SiO_2$, 25 nm thick, is formed by thermal oxidation at about 900° C., for example. In this thermal oxidation, the alignment mark 5 and the p-type silicon semiconductor substrate 1 exposed in the scribe line area are also oxidized at their surfaces, but the oxidized layer over the alignment mark 5 does not prevent the detection of the alignment mark 5 by a visible ray microscope, since the configuration of the alignment mark 5 has already been exposed and appears thereat.

Figure 6:
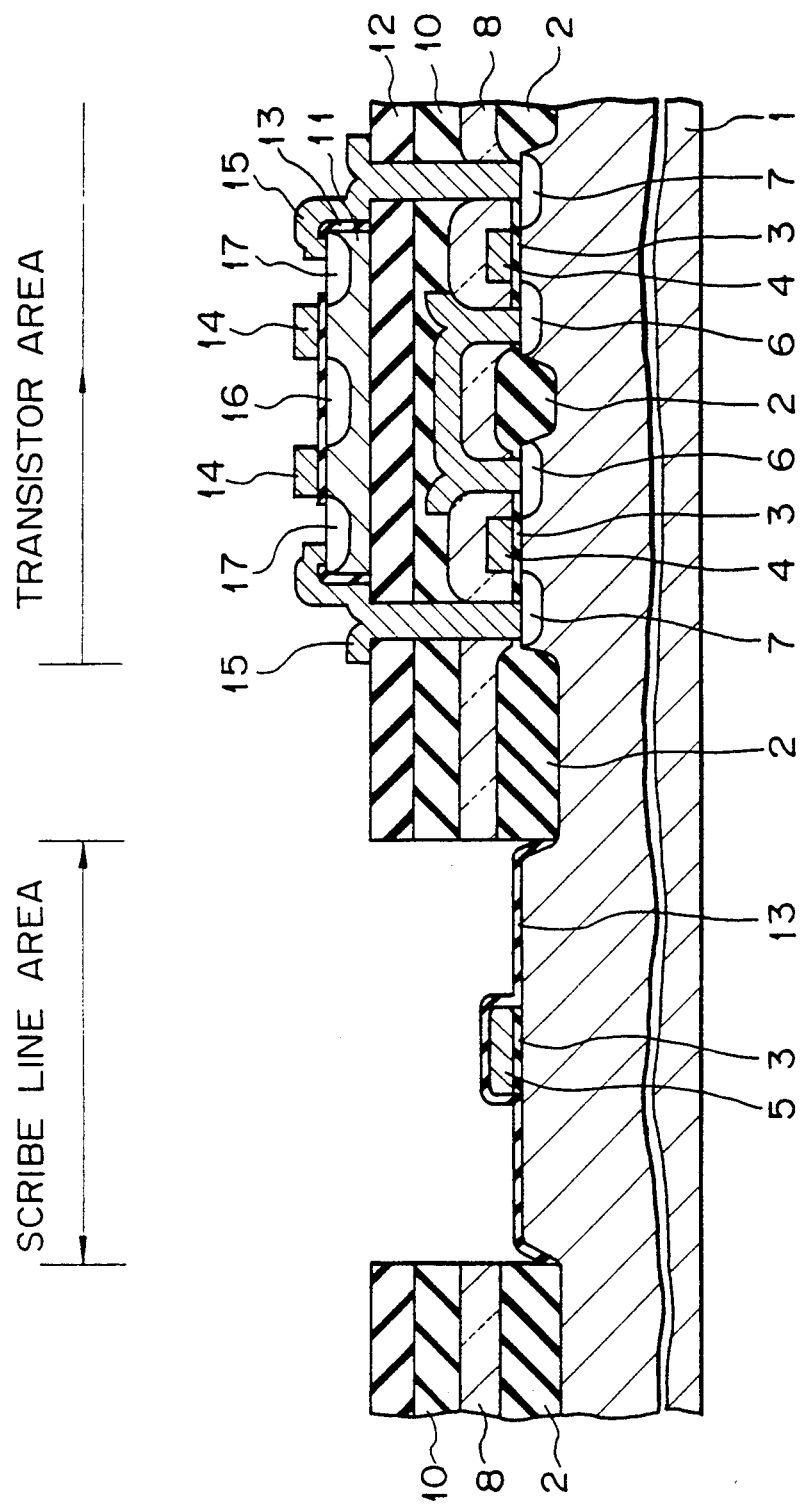

FIG. 6 is referred to.

An electrode contact hole corresponding to the $n^+$-type drain region is formed by a lithograph step, including a resist process and an RIE with $CF_4/CHF_3$ as an etchant gas, to anisotropically etch the $SiO_2$ layer 12, the $SiO_2$ layer 10, the PSG layer 8 and the gate insulating layer 3.

A W polycide layer about 300 nm thick is deposited thereover by CVD.

By a lithography step, including a resist process and an RIE with $CCl_4/O_2$ as an etching gas, the W silicide layer is patterned to form a gate electrode 14 and an interconnection line 15 connecting the $n^+$-type drain region 7 in the p-type silicon semiconductor substrate 1 and the $p^+$-type drain region 17, which will be formed later in the n-type silicon semiconductor substrate 11.

$B^+$ ion implantation is conducted at a dose of $1 \times 10^{15}$ cm$^{-2}$ and ion acceleration energy of 15 KeV to form a $p^+$-type source region 16 and $p^+$-type drain region 17.

Figure 7:
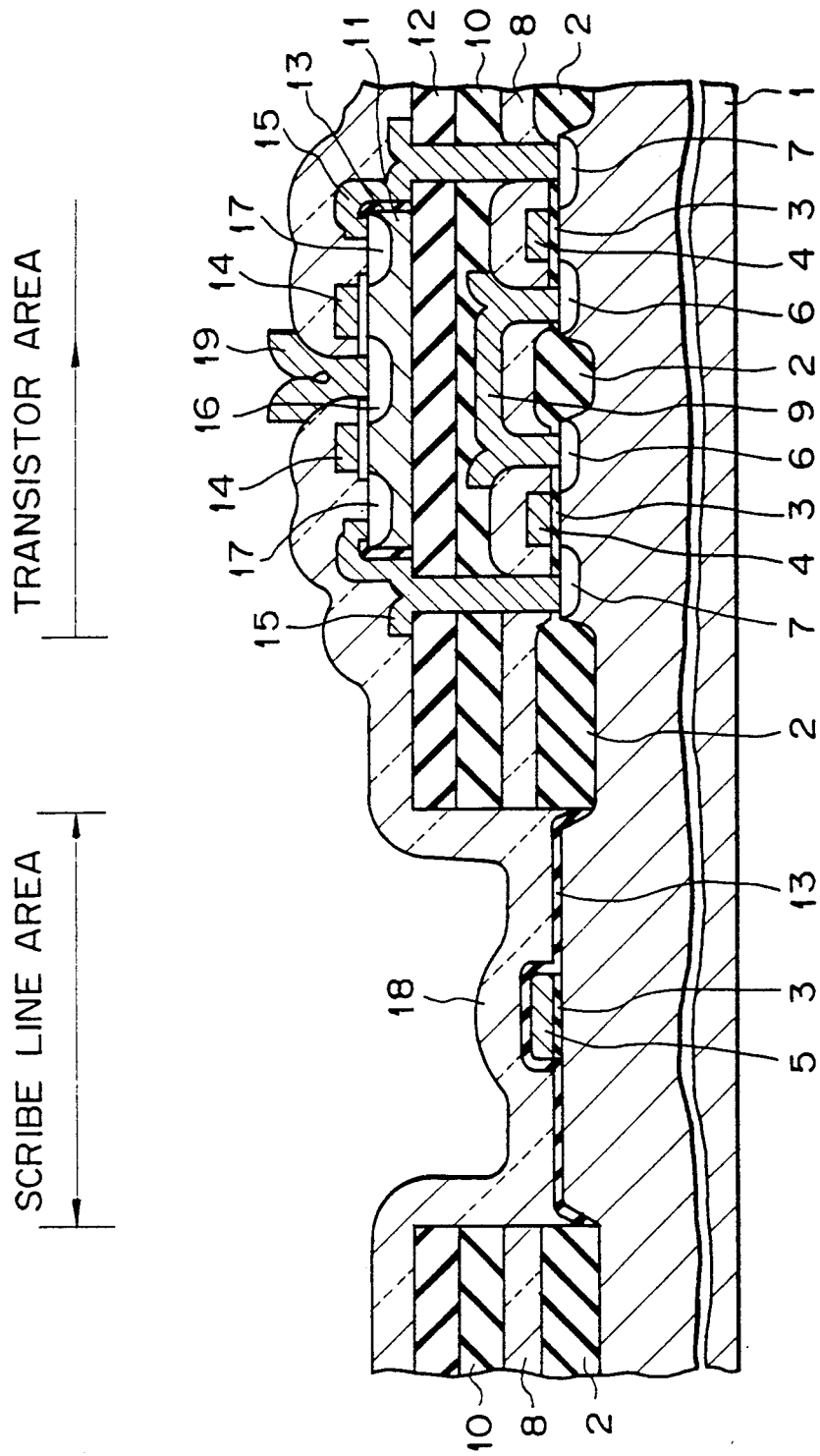

FIG. 7 is referred to.

A PSG layer 18, about 600 nm thick, is deposited by CVD. An annealing step, in an $N_2$ atmosphere at 900° C., is conducted for 30 minutes to make the surface of the PSG layer 18 smooth.

A lithography step, including a resist process and an RIE with $CF_4/CHF_3$ as an etching gas, is applied to locally etch the PSG layer 18, to thereby form an electrode contact hole corresponding to the $p^+$-type source region 16 in the n-type silicon semiconductor substrate 11.

An aluminum layer about 1 μm thick is deposited by sputtering and is patterned by a lithograph step including a resist process and an RIE with $Cl_2/BCl_3$ as an etching gas, to form an interconnection line 19.

In the three dimensional integrated circuit device manufactured in accordance with the above process, n-channel transistors are formed in the p-type silicon semiconductor substrate 1 as the first silicon semiconductor substrate and p-channel transistors are formed in the n-type silicon semiconductor substrate 11 as the second silicon semiconductor substrate. This three dimensional integrated circuit device can be operated as a CMOS memory in an SRAM by making connections as below: The $n^+$-type source regions 6 of the n-channel transistor in the p-type silicon semiconductor substrate 1, by the interconnection line 9, are connected with the ground level of the power source (Vss). The $p^+$-type source region 16 of the p-channel transistor in the n-type silicon semiconductor substrate 11, by the interconnection line 19, is connected with the positive level of the power source (Vcc). Each of the pair of the gate electrodes 4 of the n-channel transistor and of the pair of the gate electrodes 14 of the p-channel transistor is connected to each other and the thus connected pair of gate electrodes are connected with the interlayer connection line 15. The transfer gate transistors connected with the bit and word lines are through the interlayer connection line 15.

In the above example of the process for manufacturing the three dimensional integrated circuit device, when various processes are carried out after the n-type silicon semiconductor substrate 11 is bonded to the p-type silicon semiconductor substrate 1, as the alignment mark 5 formed in the p-type silicon semiconductor substrate 1, as the first semiconductor substrate, is always detected, each element in the n-type silicon semiconductor substrate 11, as the second semiconductor substrate, can be formed in the same fine alignment as that of the element in the p-type silicon semiconductor substrate 1, whereby fine elements can be formed in the n-type silicon semiconductor substrate 11 of the three dimensional integrated circuit device.

A third, or further, integrated circuit device to be formed in a third, or further, semiconductor substrate can be formed in the same manner as that used for forming the second integrated circuit device in the second semiconductor substrate, while still utilizing the alignment mark 5 in the first semiconductor substrate. Accordingly, a very fine third, or further, integrated circuit device can be obtained.

The alignment mark 5 formed on the first semiconductor substrate is not necessarily exposed by etching the layers thereon. For example, if insulating layers such as $SiO_2$, $Si_3N_4$, PSG, etc. are formed over the alignment mark 5 in the scribe line area the alignment mark 5 can be detected through these insulating layers by making the alignment mark 5 with a material different from the said insulating layers. If the material of the alignment mark 5 is also transparent, the refractive index thereof should be different from those of the insulating layers so that it is easily detected.

In the present invention, the alignment mark formed on the first semiconductor substrate is necessarily utilized for all processes for forming second and further integrated circuits in the second and further semiconductor substrates. Accordingly, the detection of the alignment mark is easy if it is made in a scribe line area, but it is not essential. For example, if an integrated circuit device comprises a plurality of groups of elements in a chip, the alignment mark may be formed in a space between said groups of elements. In such a case, the groove, and the portion of the insulating layer buried therein, of the second semiconductor substrate should be formed so as to face said space, or a portion of the second semiconductor substrate corresponding to said space should be made of a material that is easily removed.

I claim:

1. A process for manufacturing a three dimensional integrated circuit, comprising the steps of:
   I) preparing a first semiconductor substrate having a main surface in which are formed a first integrated circuit comprising element groups having a corresponding space between adjacent element groups and an alignment mark of a first width and first material, formed in the space between said element groups, forming a first insulating layer of a second material on the main surface of the first semiconductor substrate, the second material being different from the first material and the first insulating layer having a top surface, and planarizing said top surface of the first insulating layer of the first semiconductor substrate;
   II) preparing a second semiconductor substrate having a main surface and a back surface and forming a recess in said main surface at a place thereon corresponding to said space of the first semiconductor substrate, said recess of the second semiconductor substrate having a second width greater than the first width of said alignment mark, forming a second insulating layer on the main surface of the second semiconductor substrate so as to bury the recess, and planarizing the second insulating layer, so that the second semiconductor substrate has a planarized top surface, the back surface being opposite said top surface;
   III) aligning the first and second semiconductor substrates with each other, with the first and second insulating layers in facing and contiguous relationship and with said recess of the second semiconductor substrate aligned with said space of the first semiconductor substrate by a light transmitted through the second semiconductor substrate from the back surface thereof, and bonding the aligned substrates to each other at the contiguous and facing first and second insulating layers;
   IV) removing the material of the second semiconductor substrate from the back surface thereof until said second insulating layer, formed in the groove in the main surface, is exposed, and
   V) determining the location of said alignment mark of the first semiconductor substrate, and forming a second integrated circuit in the second semiconductor substrate at a position aligned with first integrated circuit, using said aligning mark of the first semiconductor substrate to determine said position.

2. A process according to claim 1, wherein said removal of the material from the back side of the second semiconductor substrate is conducted by selective etching of the second semiconductor substrate from the back side thereof, using the second insulating layer as a stopper of said selective etching and thereby to form islands of semiconductor material, from the second semiconductor substrate and surrounded by the second insulating layer.

3. A process according to claim 1, further comprising a step of exposing said alignment mark by successively removing the second and then the first insulating layers, using the semiconductor material of the first semiconductor substrate as a mask, after the step (IV) and before the step (V).

4. A process according to claim 1, wherein said detecting step for aligning said space of the first semiconductor substrate with said recess of the second semiconductor substrate is performed using an infra-red microscope.

5. A process according to claim 1, wherein said step of determining the location of said alignment mark of the first semiconductor substrate is performed using a visible light microscope.

6. A process according to claim 1, wherein each of said element groups is formed on a corresponding chip-defining area of the main surface of the first semiconductor substrate and said space is a scribe line area of the main surface of the first semiconductor substrate disposed between and provided for separating said chips.

* * * * *

UNITED STATES PATENT AND TRADEMARK OFFICE
CERTIFICATE OF CORRECTION

PATENT NO. : 5,266,511
DATED : November 30, 1993
INVENTOR(S) : TAKAO

It is certified that error appears in the above-indentified patent and that said Letters Patent is hereby corrected as shown below:

COVER PAGE: [56] References Cited, after the "U.S. Patent Documents" section, please add:

FOREIGN PATENT DOCUMENTS 3-11658   1/1991   Japan

OTHER PUBLICATIONS

Y. Inoue et al.: "4 PMOS/2 NMOS Vertically Stacked CMOS-SRAM with 0.6 $\mu$m Design Rule," Symposium on VLSI Technology, *TECHNICAL DIGEST*, 1989, pages 39-40.

Y. Hayashi, "CUBIC," *SEMICONDUCTOR WORLD*, September 1990, pages 58-64.

Y. Hayashi, "Evaluation of CUBIC (Cumulatively Bonded IC) Devices," *9TH SYMPOSIUM ON FUTURE ELECTRON DEVICES*, November 14-15, 1990, Makuhari, Chiba, Japan, pages 267-272.

UNITED STATES PATENT AND TRADEMARK OFFICE
CERTIFICATE OF CORRECTION

PATENT NO. : 5,266,511
DATED : November 30, 1993
INVENTOR(S) : TAKAO

It is certified that error appears in the above-indentified patent and that said Letters Patent is hereby corrected as shown below:

Col. 4, line 40, after "surface)" insert --thereof--.

Col. 5, line 37, delete "52665114.002".

Col. 6, line 12, change "lithograph" to --lithography--;
* line 36, after "transistors" insert --are--;
* line 37, delete "are";
line 65, after "area" insert --,--.

Signed and Sealed this

First Day of November, 1994

Attest:

BRUCE LEHMAN

Attesting Officer

Commissioner of Patents and Trademarks